United States Patent
Kang et al.

(10) Patent No.: US 12,019,323 B2
(45) Date of Patent: Jun. 25, 2024

(54) DISPLAY DEVICE

(71) Applicant: LG ELECTRONICS INC., Seoul (KR)

(72) Inventors: Seunggyu Kang, Seoul (KR); Taegewn Kim, Seoul (KR); Hyuncheol Cho, Seoul (KR)

(73) Assignee: LG ELECTRONICS INC., Seoul (KR)

(*) Notice: Subject to any disclaimer, the term of this patent is extended or adjusted under 35 U.S.C. 154(b) by 128 days.

(21) Appl. No.: 17/765,338

(22) PCT Filed: Oct. 18, 2019

(86) PCT No.: PCT/KR2019/013747
§ 371 (c)(1),
(2) Date: Mar. 30, 2022

(87) PCT Pub. No.: WO2021/075612
PCT Pub. Date: Apr. 22, 2021

(65) Prior Publication Data
US 2022/0342255 A1 Oct. 27, 2022

(51) Int. Cl.
*G02F 1/1339* (2006.01)
*G02F 1/1333* (2006.01)

(52) U.S. Cl.
CPC .... *G02F 1/133314* (2021.01); *G02F 1/13332* (2021.01); *G02F 1/133322* (2021.01); *G02F 1/1339* (2013.01)

(58) Field of Classification Search
CPC .............. G02F 1/1339; G02F 1/13332; G02F 1/133322; G02F 1/133314
USPC ........................................... 349/56
See application file for complete search history.

(56) References Cited

U.S. PATENT DOCUMENTS

| 2008/0165496 | A1* | 7/2008 | Kang ............... G02F 1/133385 |
| | | | 361/692 |
| 2014/0375923 | A1 | 12/2014 | Chai |
| 2015/0373859 | A1* | 12/2015 | Hwang ............... G02B 6/0091 |
| | | | 361/752 |
| 2016/0044802 | A1* | 2/2016 | Kim ..................... H04N 5/64 |
| | | | 361/679.01 |

(Continued)

FOREIGN PATENT DOCUMENTS

| KR | 1020150115099 | 10/2015 |
| KR | 1020150137819 | 12/2015 |

(Continued)

OTHER PUBLICATIONS

European Patent Office Application Serial No. 19949183.8, Search Report dated May 12, 2023, 15 pages.

(Continued)

*Primary Examiner* — Christopher M Raabe
(74) *Attorney, Agent, or Firm* — LEE, HONG, DEGERMAN, KANG & WAIMEY

(57) ABSTRACT

A display device according to one aspect of the present invention comprises: a display panel; a front frame to which the display panel is attached; and a rear frame coupled to the rear of the front frame, wherein the front frame comprises a rectangular-band-shaped seating part pressing towards the rear frame and formed along the edge of the device, and the rear frame comprises a coupling part mechanically joined to the seating part.

16 Claims, 18 Drawing Sheets

(56) References Cited

U.S. PATENT DOCUMENTS

| | | | |
|---|---|---|---|
| 2016/0116661 A1* | 4/2016 | Kobayashi | H04N 21/4312 |
| | | | 362/613 |
| 2017/0118859 A1 | 4/2017 | Kang et al. | |
| 2017/0192289 A1* | 7/2017 | Won | G02F 1/133512 |
| 2017/0336669 A1* | 11/2017 | Jeong | G02F 1/133308 |
| 2018/0356672 A1* | 12/2018 | Kim | G02F 1/1339 |
| 2019/0029129 A1* | 1/2019 | Kang | H05K 5/0247 |
| 2019/0132963 A1 | 5/2019 | Yu et al. | |
| 2021/0048857 A1* | 2/2021 | Kang | F16M 11/04 |
| 2021/0116958 A1* | 4/2021 | Ryu | G02F 1/133308 |
| 2021/0132432 A1* | 5/2021 | Sasaki | G02F 1/13332 |
| 2021/0261035 A1* | 8/2021 | Seitz | B62D 33/04 |
| 2021/0263373 A1* | 8/2021 | Kang | G02F 1/133314 |
| 2021/0405282 A1* | 12/2021 | Xu | G02F 1/133322 |
| 2023/0076484 A1* | 3/2023 | Chen | B23P 15/00 |

FOREIGN PATENT DOCUMENTS

| | | |
|---|---|---|
| KR | 1020160069422 | 6/2016 |
| KR | 1020170106826 | 9/2017 |
| KR | 1020190034969 | 4/2019 |

OTHER PUBLICATIONS

PCT International Application No. PCT/KR2019/013747, International Search Report dated Jul. 17, 2020, 4 pages.

* cited by examiner

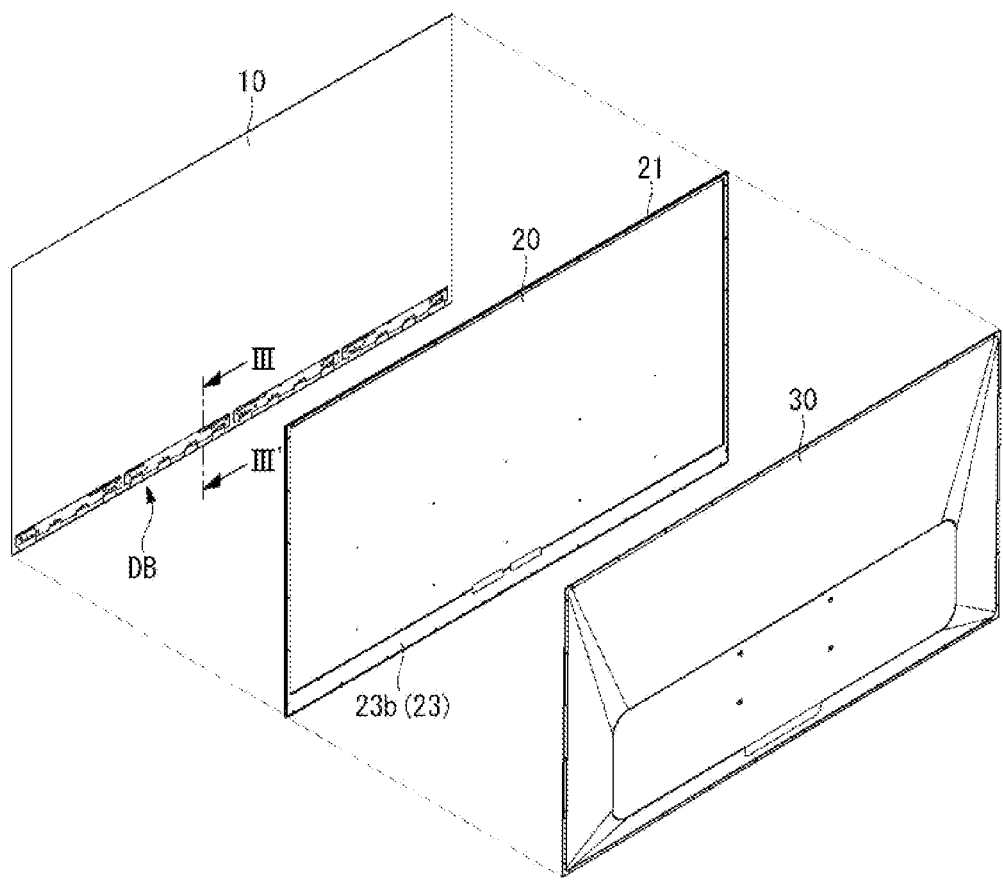
【FIG. 1】

[FIG. 2]
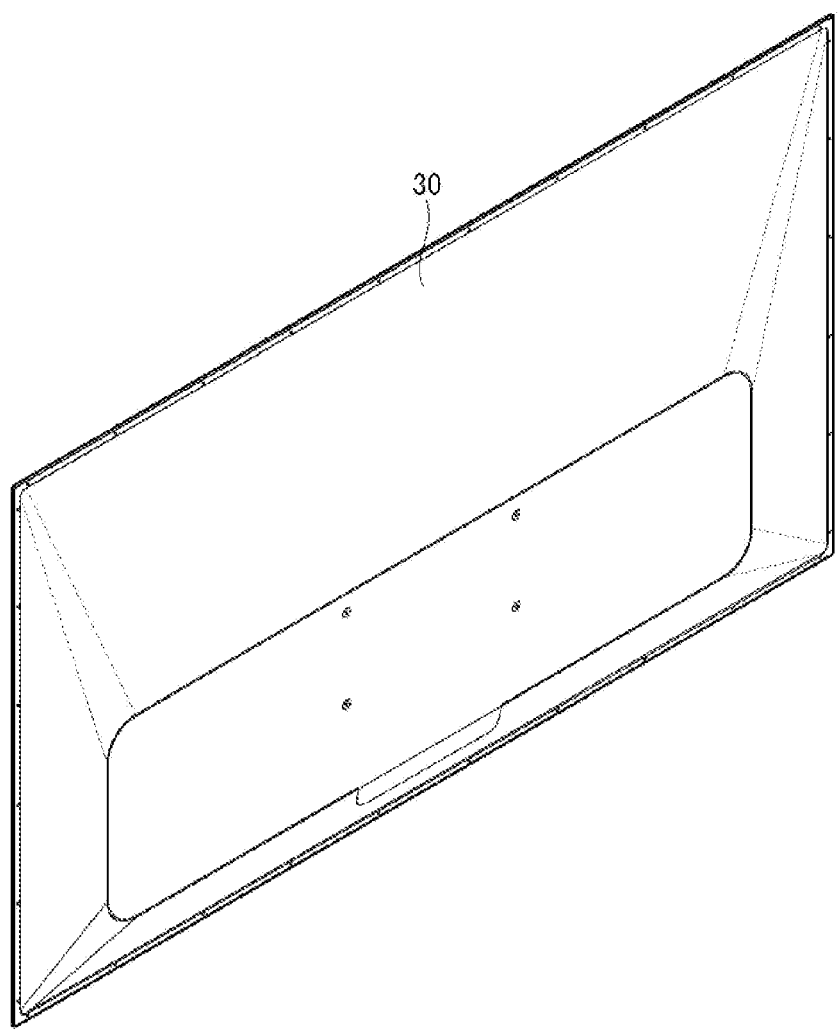

[FIG. 3]
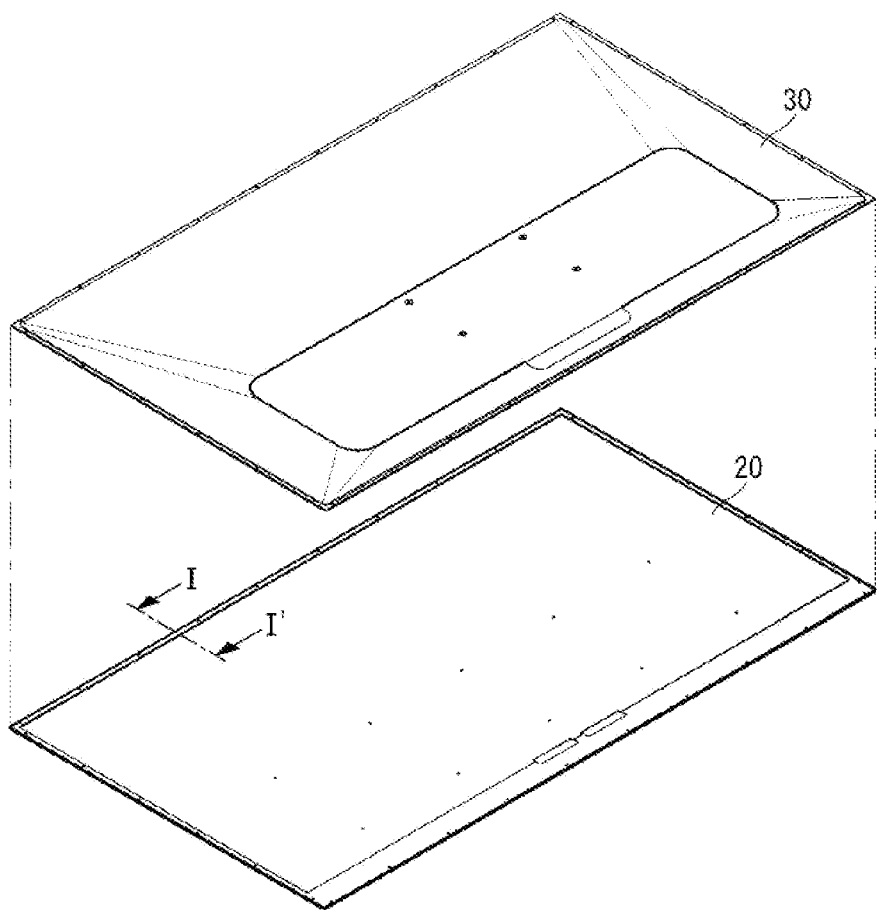

[FIG. 4]
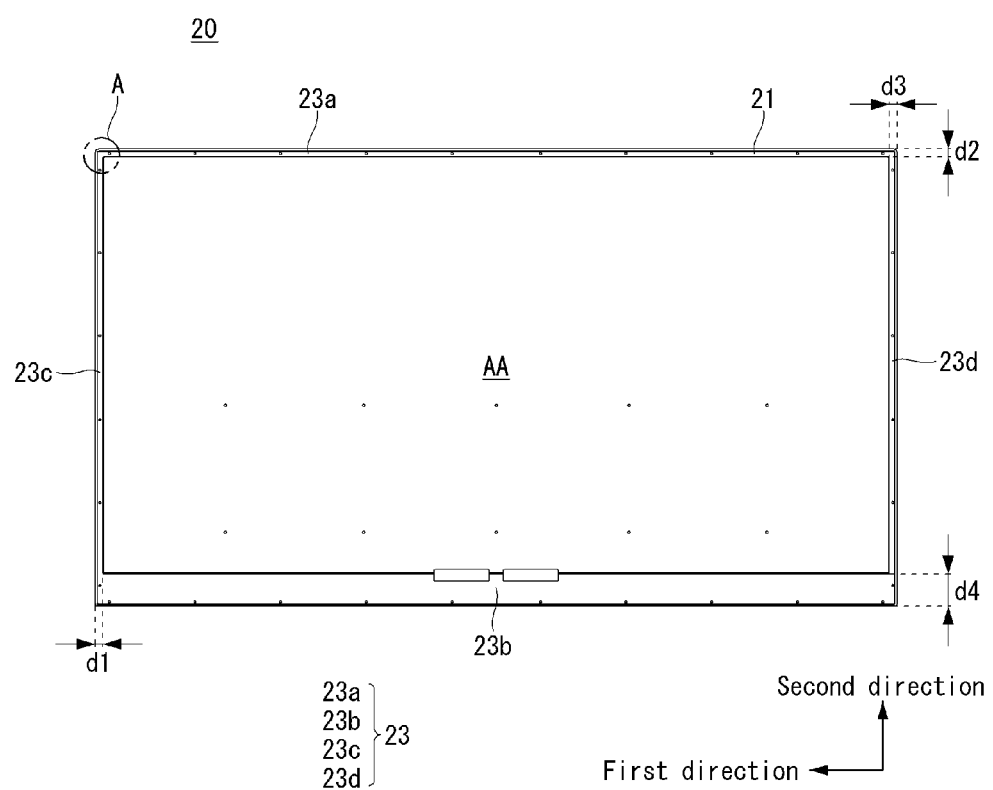

【FIG. 5】
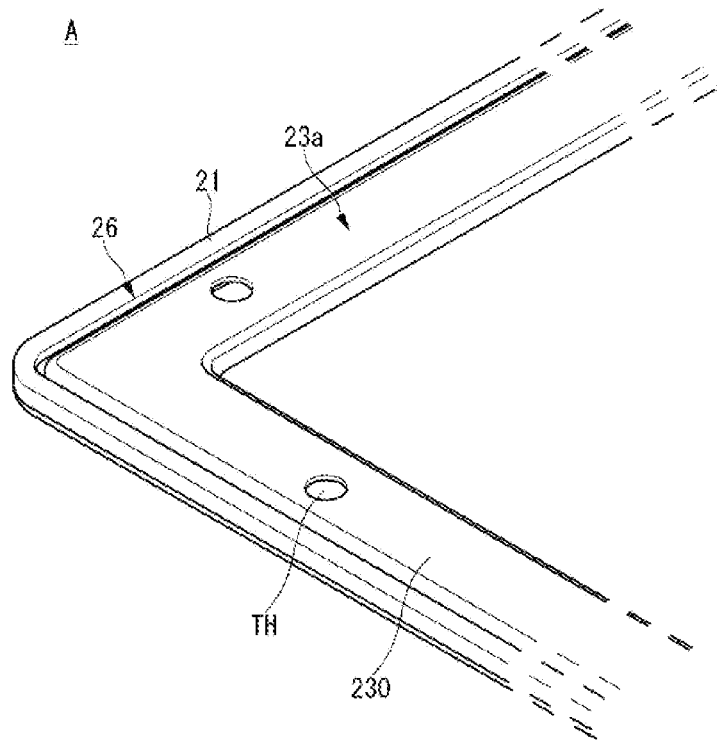
【FIG. 6】
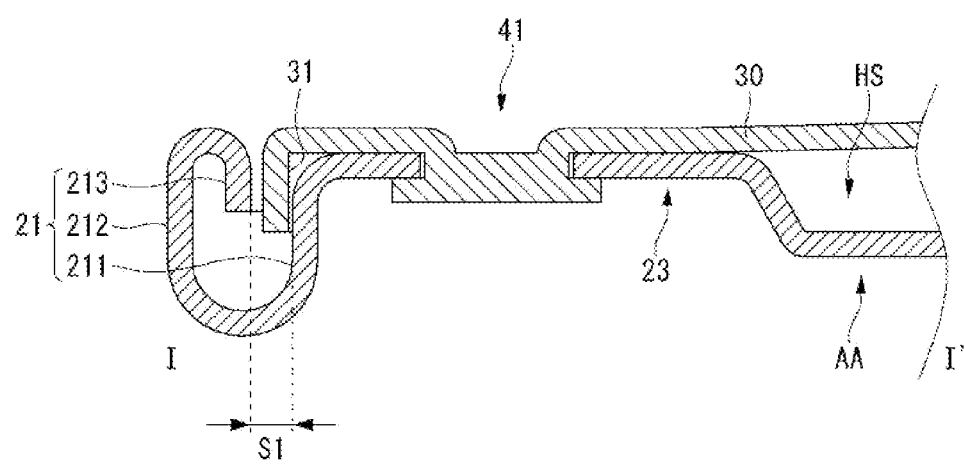

[FIG. 7]
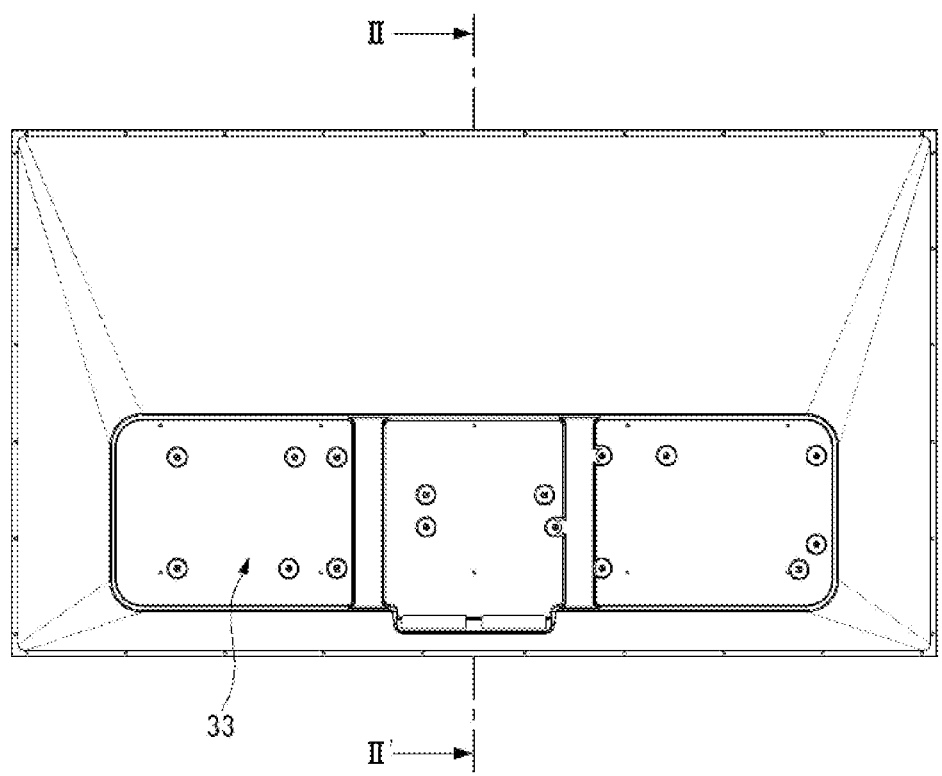

[FIG. 8]
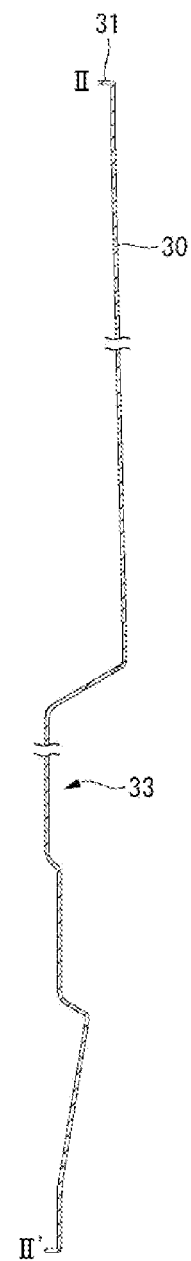

【FIG. 9】
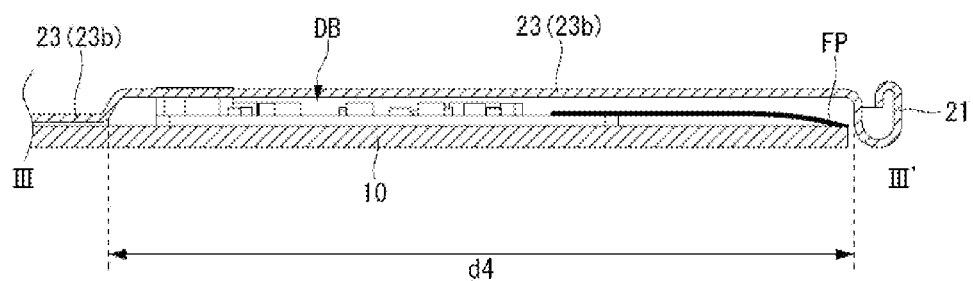
【FIG. 10】
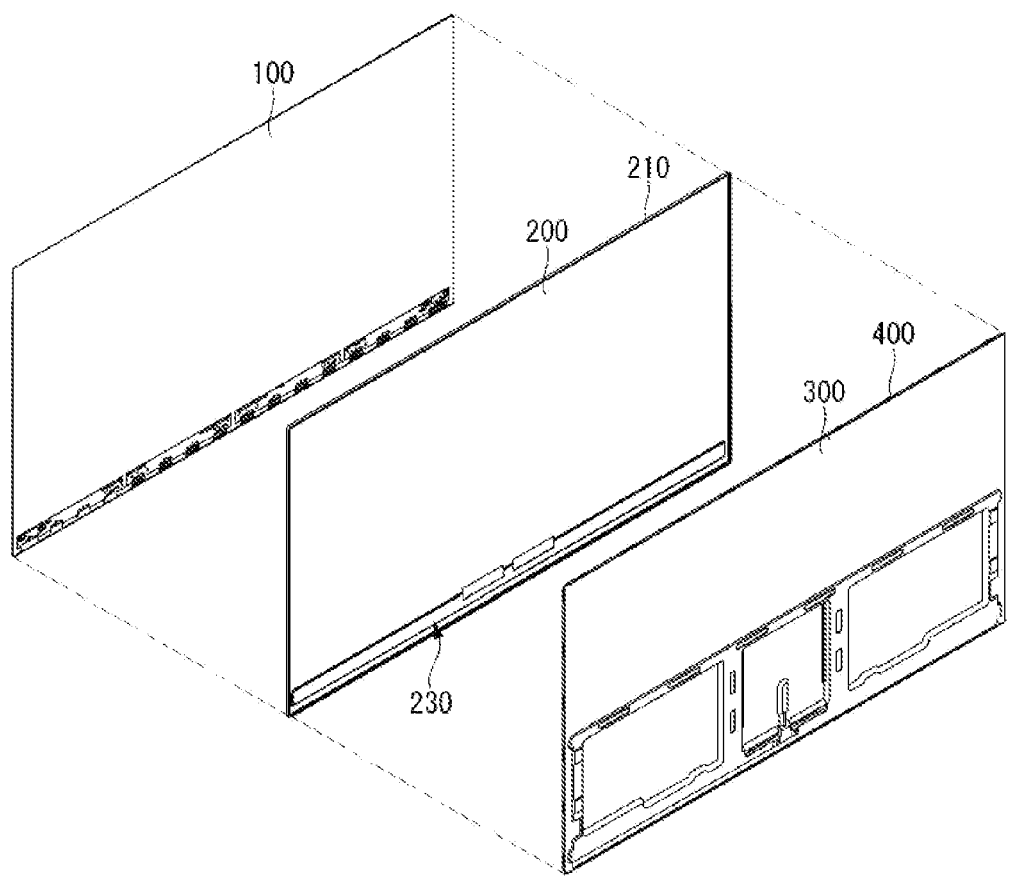

【FIG. 11】
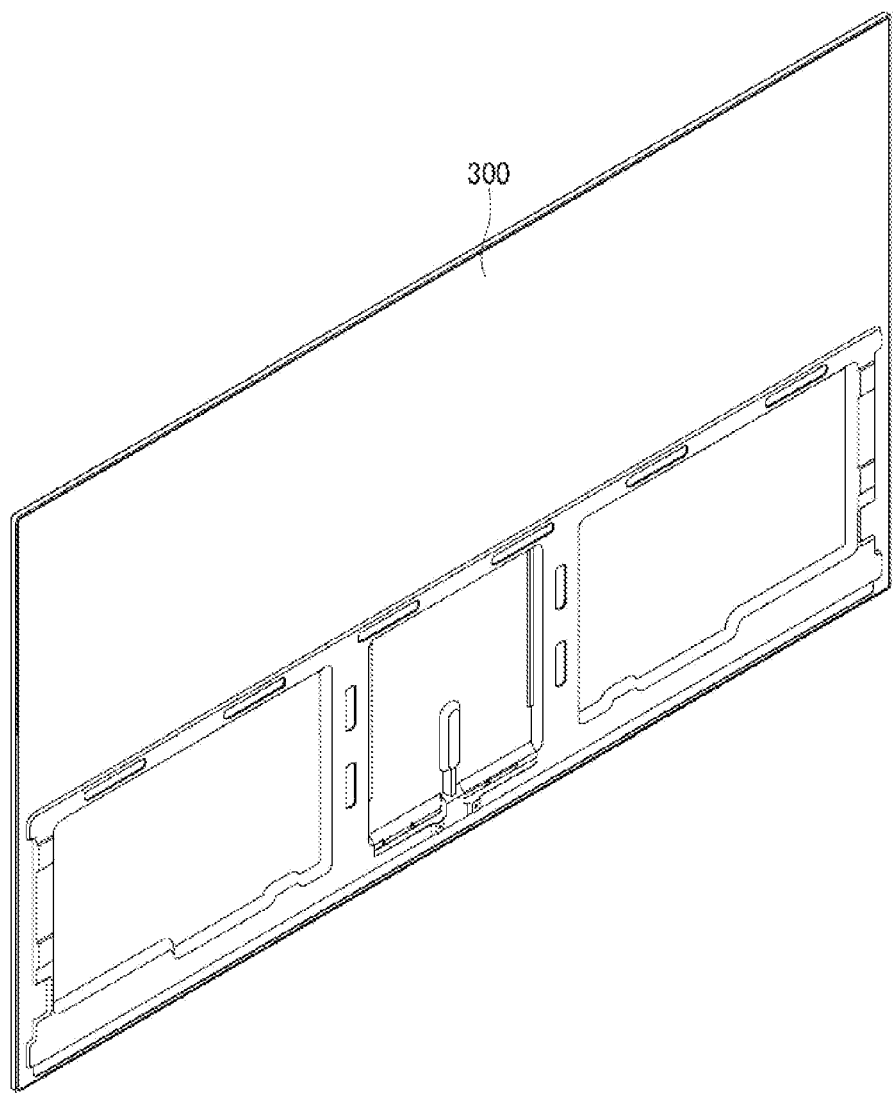

[FIG. 12]
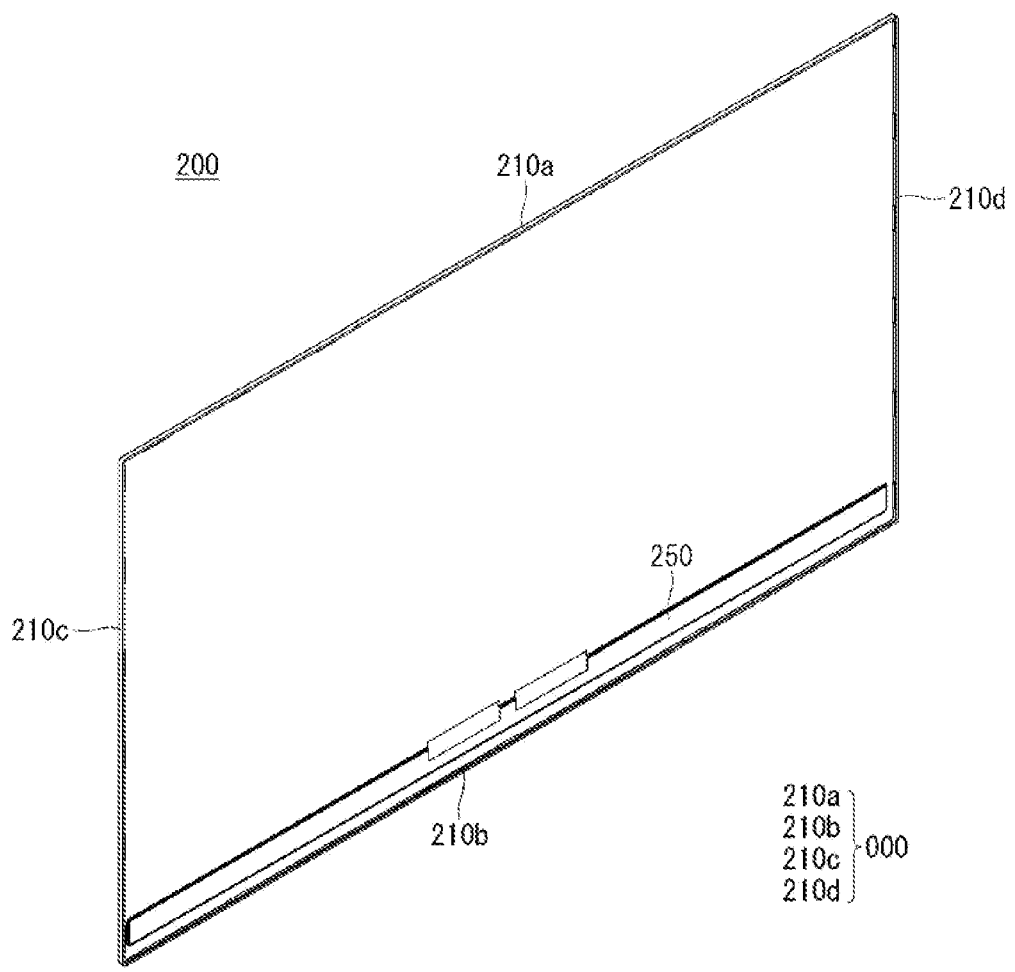

[FIG. 13]
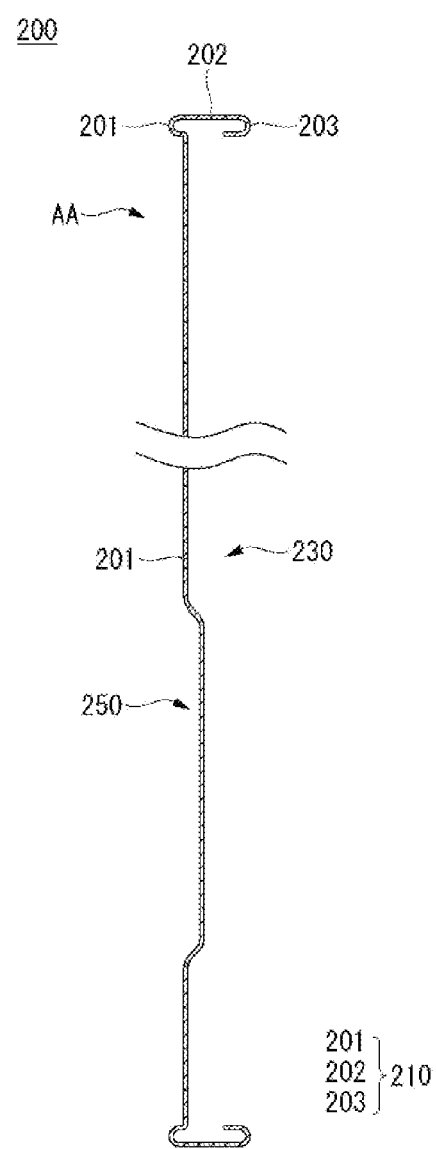

[FIG. 14]
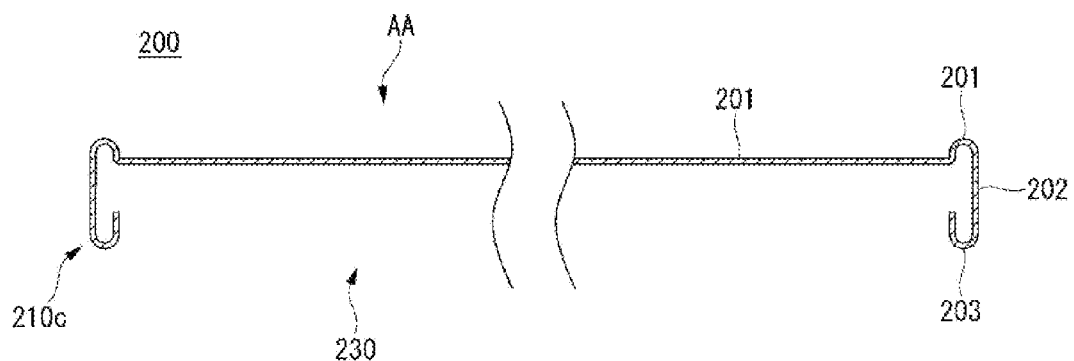

【FIG. 15】
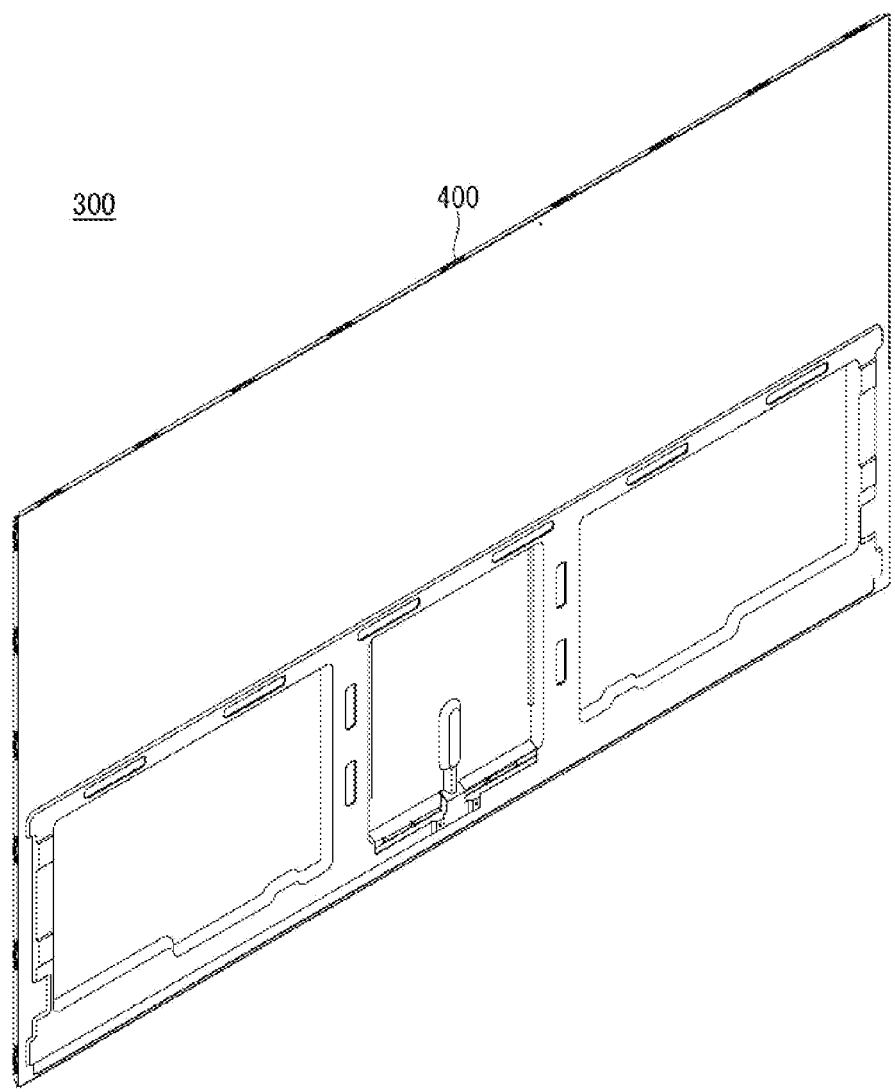

[FIG. 16]
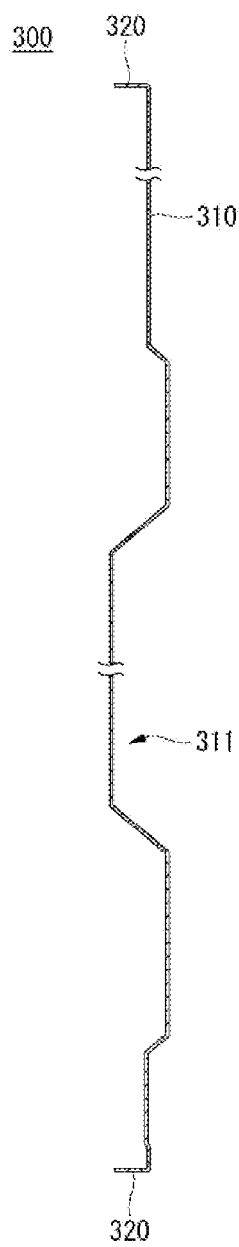

[FIG. 17]
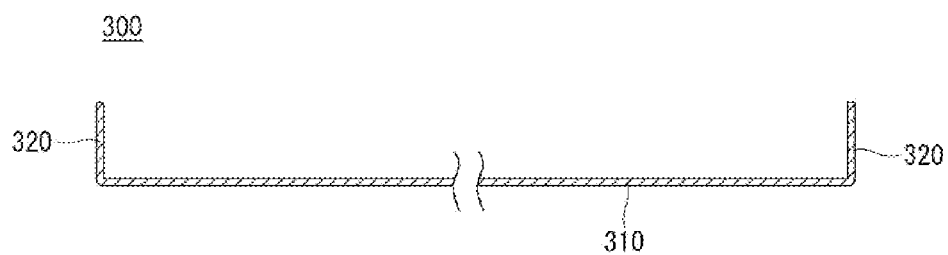
[FIG. 18]
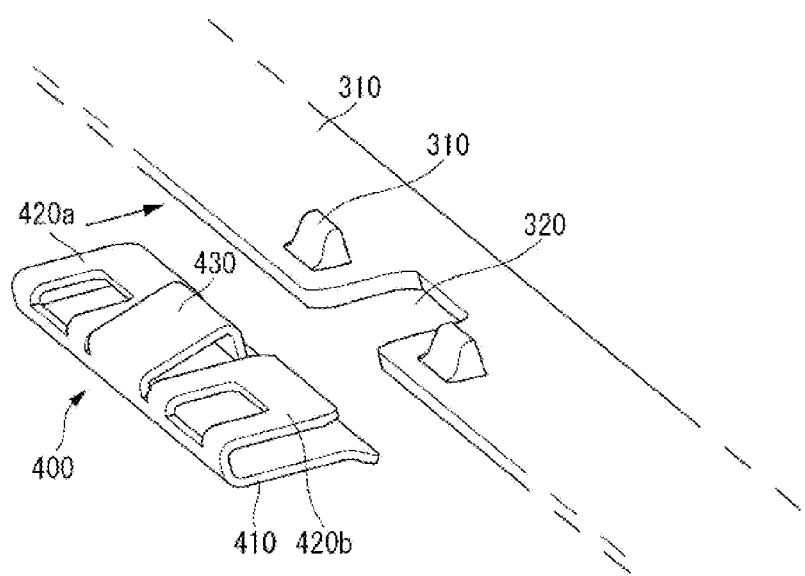

[FIG. 19]
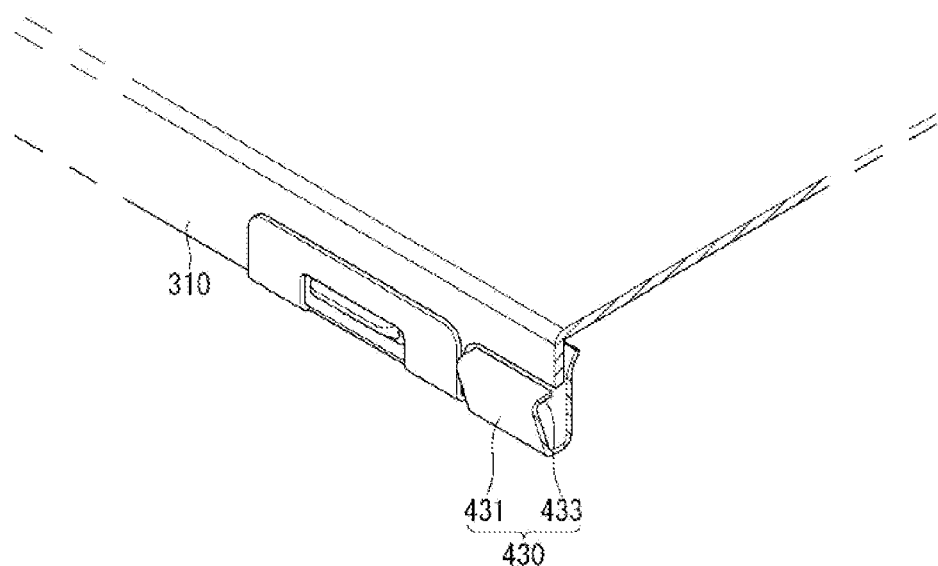

【FIG. 20】
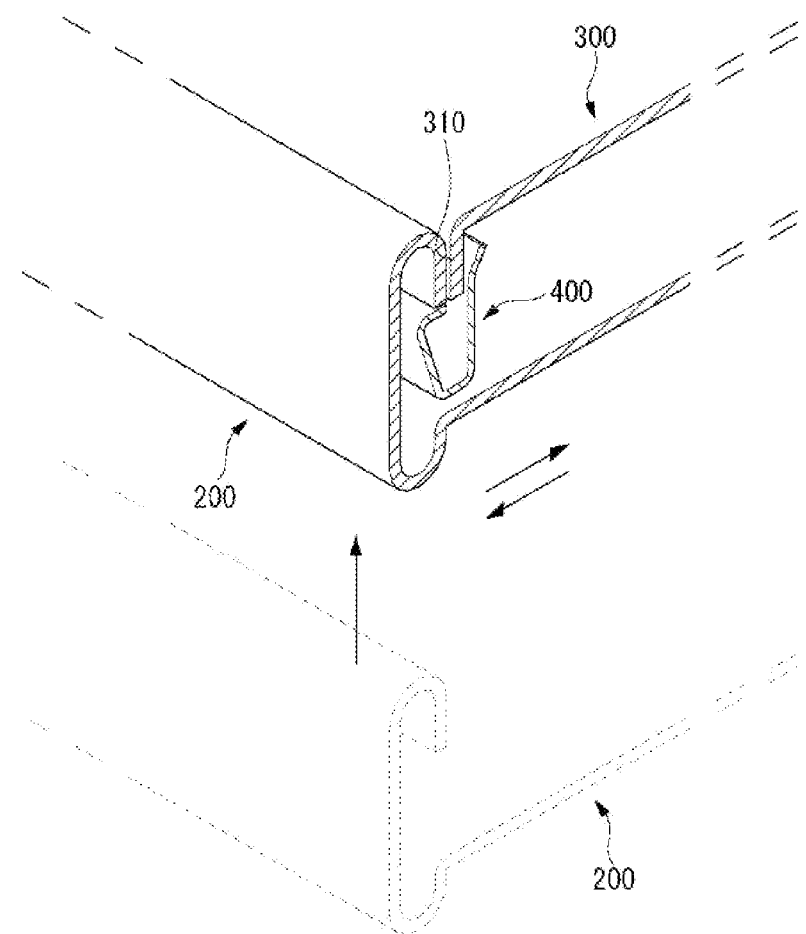
【FIG. 21】
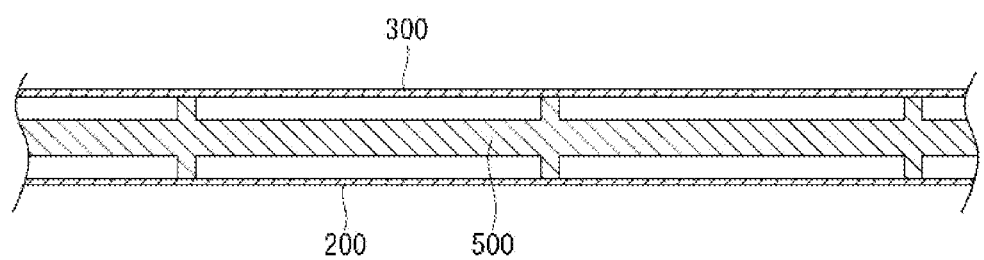

【FIG. 22】
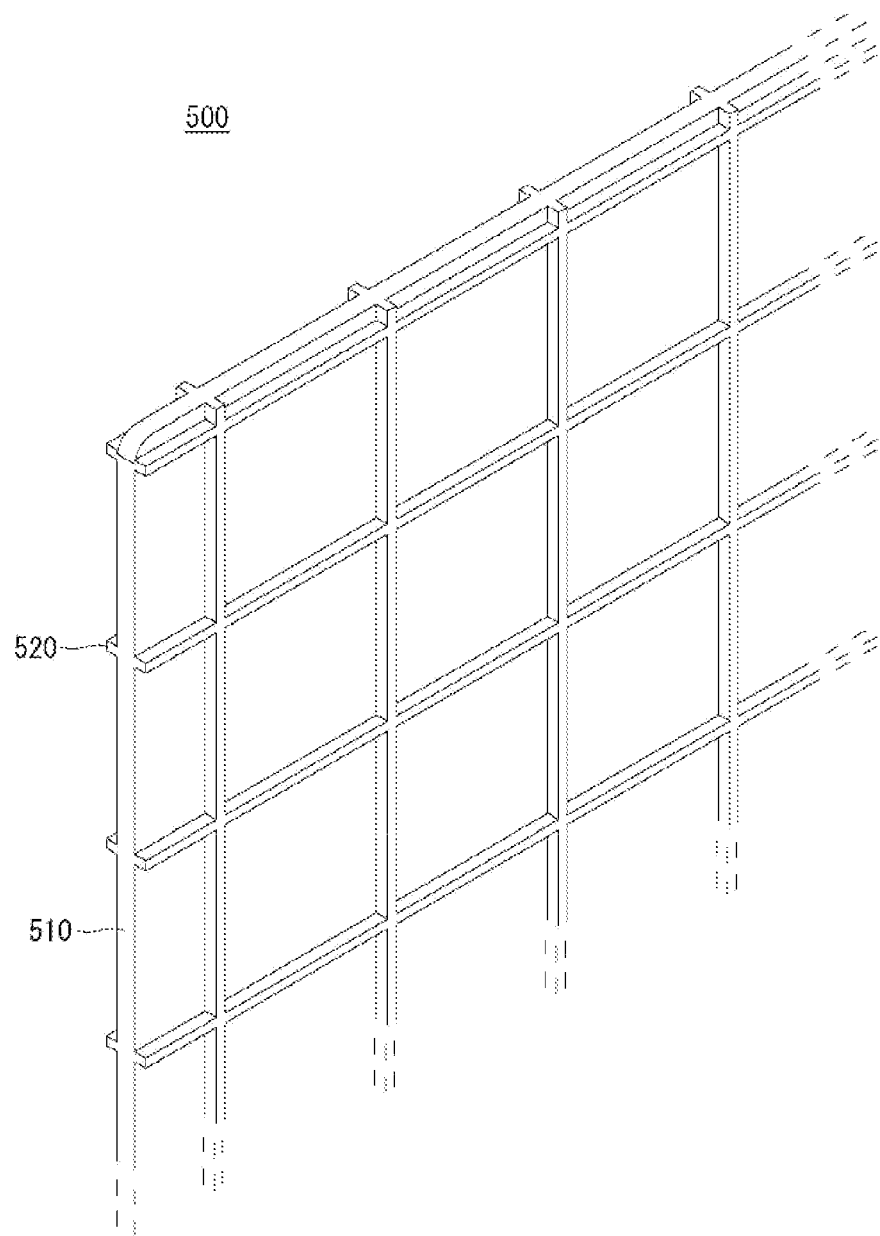

DISPLAY DEVICE

CROSS-REFERENCE TO RELATED APPLICATIONS

This application is the National Stage filing under 35 U.S.C. 371 of International Application No. PCT/KR2019/013747, filed on Oct. 18, 2019, the contents of which are all incorporated by reference herein in their entirety.

TECHNICAL FIELD

The present disclosure relates to a display device having reduced volume and weight.

BACKGROUND ART

As the information society develops, the demand for display devices is also increasing in various forms, and in response to this, various display devices such as a liquid crystal display device (LCD), a plasma display panel (PDP), an electroluminescent display (ELD), a vacuum fluorescent display (VFD), and an organic light emitting diode (OLED) have been researched and used.

Among them, the display device using the organic light emitting diode (OLED) has excellent luminance characteristics and viewing angle characteristics compared to the liquid crystal display device, and does not require a backlight unit, so that it can be implemented in an ultra-thin shape.

DETAILED DESCRIPTION OF INVENTION

Technical Problem

The present disclosure aims to solve the above-mentioned problems and other problems.

Another object of the present disclosure is to reduce the thickness and volume of a display device.

Another object of the present disclosure is to increase structural rigidity and reduce weight of a display device.

Technical Solution

According to an aspect of the present disclosure in order to achieve the above objects, the display device comprises a display panel, a front frame attached to the display panel, and a rear frame coupled to a rear of the front frame, wherein the front frame is pressed toward the rear frame, and includes a rectangular band-shaped seating portion formed along a border of the device, and wherein the rear frame includes a coupling portion mechanically bonded to the seating portion.

The front frame includes an edge portion bent to be contiguous to the seating portion and forming the border of the device, the rear frame includes an insert bent toward the front frame, the insert is inserted and fastened between the edge portion and the seating portion.

The mechanical bonding may be either clinching or spot welding.

The edge portion includes a first part protruding forward, a second part folded outwards from the first part, and a third part folded between the first part and the first part in the second part.

The rear frame has an arch shape that is gradually convex backward from an end at which the insert is formed to a portion at which the receiving portion is formed.

The display device comprises a driving board disposed on a rear side of the display panel, wherein the driving board is accommodated in the seating portion.

Another display device of the present disclosure comprises a display panel, a front frame including a bottom portion to which the display panel is attached to a front side, and an edge portion bent toward a rear at an end of the bottom portion, a rear frame inserted and fastened inwardly into a receiving space defined by the edge portion, and a clip fastening the front frame and the rear frame.

The rear frame includes a flat portion facing the bottom portion at a predetermined distance and a bending portion bent toward the front frame at an end of the flat portion.

The edge portion includes a first part protruding forward, a second part protruding rearward from the first part, and a third part folded inward toward a front from the second part.

The clip includes a body fitted to the bending portion, and a locking portion having tension and protruding from the body toward the edge portion and restraining the third part.

The bending portion includes a cutout portion formed in a region related to the locking portion.

The locking portion includes a first member formed as an uphill slope from the front to the rear, and a second member bent from the first member toward the cutout portion.

The device may further comprise a spacer disposed between the front frame and the rear frame, and the spacer includes a plate and a grid portion protruding from the plate in a grid shape.

Advantageous Effects

The effect of the display device according to the present disclosure will be described as follows.

According to an embodiment of the present disclosure, since the frame is configured to include the front and rear frames, the thickness and volume of the display device can be effectively reduced.

According to an embodiment of the present disclosure, since the frame is configured to include the front and rear frames, the structural rigidity and weight of the display device can be effectively reduced.

Additional scope of applicability of the present disclosure will become apparent from the following detailed description. However, various changes and modifications within the spirit and scope of the present disclosure may be clearly understood by those skilled in the art, and thus, it should be understood that specific embodiments, such as the detailed description and preferred embodiments of the present disclosure, are given only by way of illustration.

DESCRIPTION OF DRAWINGS

FIG. 1 shows an exploded display device.

FIG. 2 shows a combined display device of FIG. 1.

FIG. 3 is an exploded view of a front frame and a rear frame.

FIG. 4 shows a rear view of a front frame.

FIG. 5 is an enlarged perspective view of part A of FIG. 4.

FIG. 6 shows a cross-sectional view taken along line I-I' of FIG. 3.

FIG. 7 shows a rear view of a rear frame.

FIG. 8 shows a cross-sectional view taken along line II-II' of FIG. 7.

FIG. 9 shows a bonding state between a display panel and a front frame in a cross-section taken along line III-III' of FIG. 1.

FIG. 10 is an exploded perspective view of a display device according to another embodiment.

FIG. 11 is a view showing a combination of a device shown in FIG. 10.

FIGS. 12 to 14 are views for illustrating a front frame.

FIGS. 15 to 17 are views for illustrating a rear frame.

FIG. 18 is a view showing a clip is disassembled with a rear frame.

FIG. 19 shows a cross-sectional view in a state in which a clip is fastened to a bending portion and cut around a locking portion.

FIG. 20 shows a state in which a front frame 200 is fastened to a rear frame 300 through a clip.

FIG. 21 shows a state in which a spacer is disposed to maintain a gap in a heat dissipation space between a front frame and a rear frame.

FIG. 22 shows an example of a spacer.

MODE FOR INVENTION

Hereinafter, embodiments disclosed in the present disclosure are described in detail with reference to the accompanying drawings. The same or similar reference numerals are assigned to the same or similar elements regardless of their reference numerals, and redundant descriptions thereof are omitted.

It is to be noted that the suffixes of elements used in the following description, such as a "module" and a "unit", are assigned or interchangeable with each other by taking into consideration only the ease of writing the present disclosure, but in themselves are not particularly given distinct meanings and roles. Furthermore, in describing the embodiments disclosed in the present disclosure, a detailed description of a related known technology will be omitted if it is deemed to make the gist of the present disclosure vague. Furthermore, the accompanying drawings are merely intended to make easily understood the exemplary embodiments disclosed in the present disclosure, and the technical spirit disclosed in the present disclosure is not restricted by the accompanying drawings and includes all modifications, equivalents, and substitutions which fall within the spirit and technological scope of the present disclosure.

Terms including ordinal numbers, such as the first and the second, may be used to describe various elements, but the elements are not restricted by the terms. The terms are used to only distinguish one element from the other element.

When it is said that one element is "connected" or "coupled" to the other element, it should be understood that one element may be directly connected or coupled" to the other element, but a third element may exist between the two elements. In contrast, when it is said that one element is "directly connected" or "directly coupled" to the other element, it should be understood that a third element does not exist between the two elements.

An expression of the singular number may include an expression of the plural number unless clearly defined otherwise in the context.

It is to be understood that in this application, a term, such as "include" or "have", is intended to designate that a characteristic, number, step, operation, element, part or a combination of them described in the specification is present, and does not exclude the presence or addition possibility of one or more other characteristics, numbers, steps, operations, elements, parts, or combinations of them in advance.

The display panel applicable to the present disclosure may be an organic light emitting diode (OLED), a plasma display panel (PDP), a field emission display panel (FED), and a liquid crystal display (LCD). The following embodiment description describes an example in which the display panel is constituted by the organic light emitting diode.

In the present disclosure, as for the front/rear side, the direction in which the image is displayed is referred to as the front or front side, and the direction opposite to the front is referred to as the rear or rear side based on the direction in which the image is displayed.

Hereinafter, a display device according to an embodiment of the present disclosure will be described with reference to the accompanying drawings.

FIGS. 1 and 2 illustrate an appearance of a display device according to an embodiment of the present disclosure. FIG. 1 shows an exploded display device, and FIG. 2 shows a combined display device of FIG. 1.

A display device according to an embodiment may include a display panel 10, a front frame 20, and a rear frame 30.

The display panel 10 is disposed on the front side of the device 10, and displays an image. The display panel 10 may have a thin thickness of about 1 mm or more, and may have a rectangular shape having a horizontal length longer than a vertical one. The size of the display panel 10 may be determined based on the size of the screen.

The front frame 20 and the rear frame 30 form a set to support the display panel 10. Among them, the front frame 20 is positioned closer to the display panel 10 than the rear frame 30, and thus the display panel 10 may be substantially attached to the front frame 20.

More precisely, the display panel 10 may be attached to a panel adhesive area AA provided by the front frame 20 through an adhesive means such as a double-sided tape. The panel adhesive area AA may be defined by an edge portion 21 forming a border of the device. The edge portion 21 may be formed on the front frame 20, and may be formed by curling a portion of an end of the front frame 20. This will be described later.

The front frame 20 may be disposed to face the front frame 20 such that the frame panel area of the front frame, also referred to as a panel adhesive area AA, faces the display panel 10. The display panel 10 is positioned and fixed in the panel adhesive area AA. At this time, the edge portion 21 of the front frame 20 surrounds the side surface of the display panel 10 to protect the display panel 10 from physical impact. When viewed from the front, the edge portion 21 functions as a bezel, but the width thereof is so thin that it appears as if there is substantially no bezel.

The front frame 20 may be configured to further include a seating portion 23 pressed toward the rear. The seating part 23 disposed along the border may have a rectangular band shape.

The rear frame 30 may be positioned in the rear of the front frame 20. Since the front frame 20 is interposed between the rear frame 30 and the display panel 10, the rear frame 30 does not directly contact the display panel 10.

The rear frame 30 may have substantially the same size as the front frame 20, may be coupled to the front frame 20, and may support the display panel 10.

In one embodiment, it is possible to reduce the weight of the device by reducing the thickness of the frame based on the frame supporting the display panel 10 being made of a set of the front frame and the rear frame. In addition, a space for convective heat dissipation may be formed between the front frame 20 and the rear frame 30 to improve heat dissipation performance.

The rear frame 30 may have a different shape from the front frame 20 for structural rigidity. Based on the front frame 20 having a flat shape as a whole since the display panel 10 is attached to it, the rear frame 30 may form a convective heat dissipation space with the front frame 20, and a center portion may be formed higher than a border portion in order to increase structural rigidity.

In one embodiment, the rear frame 30 may be fitted to the front frame 20. This will be described with reference to FIGS. 3 to 6.

FIG. 3 is an exploded view of a front frame and a rear frame, FIG. 4 shows a rear view of a front frame, FIG. 5 is an enlarged perspective view of part A of FIG. 4, and FIG. 6 shows a cross-sectional view taken along line I-I' of FIG. 3.

Referring to these drawings, the front frame 20 is positioned in front of the rear frame 30 and has a roughly rectangular shape. The front frame 20 includes the edge portion 21 formed at the end. The edge portion 21 may be formed by pressing the front frame 20 in one example, and more precisely, may be formed by curling the end portion.

The edge portion 21 may be formed on the entire circumference of the front frame 20, and the panel adhesive area AA to which the display panel 10 is attached may be defined on the front side by the edge portion 21. This edge portion 21 may form a border appearance of the device.

The edge portion 21 may be configured to include a first part 211 bent in a first direction (front direction), a second part 212 folded outward from the first part 211, and a third part 123 folded between the first part 211 and the second part 213 in the second part 212. In this case, the third part 123 may be positioned to be spaced apart from the first part 121 by a predetermined width S1.

In addition, the front frame 20 may be configured to further include a seating portion 23 formed contiguous to the edge portion 21.

The seating portion 23 may be formed by pressing a portion of the frame 20 to protrude rearward. The seating portion 23 may be formed along the border of the device, more precisely, along the edge portion 21 to have a rectangular band shape as a whole.

The seating portion 23 includes first to fourth seating portions 23a to 23d based on positions. The first seating part 23a and the second seating part 23b are disposed contiguous to the edge portion 21 on the upper side and the lower side of the device, respectively, and the third seating portion 23c and the fourth seating portion 23d are disposed contiguous to the edge portion 21 on the left and right sides, respectively.

The widths d1 to d3 of the first to third seating parts 23a to 23c may be all the same, and the width d4 of the fourth seating part 23d may be greater than the width of the other seating parts 23a to 23c. A driving board mounted on the back side of the display panel 10 may be positioned on the back side of the fourth seating part 23d.

Since the front frame 20 is configured to include the seating portion 23 protruding to the rear, based on the rear frame 30 being combined with the front frame 20, a heat dissipation space HS for dissipating heat may be provided between the two. Therefore, heat generated while the display panel 10 operates may be transferred and dissipated to the front frame 20 that is primarily in contact with the surface, and secondarily, the heat may be dissipated by propagating to the heat dissipation space HS provided between the front frame 20 and the rear frame 30.

On the other hand, the rear frame 30 is positioned in contact with (referring to the face and the face meet) a bonding portion 23, and a coupling portion 235 is formed in the bonding portion 23 and is fastened to the front frame 20.

In a preferred form, the rear frame 30 and the front frame 20 may be bonded through various methods. For example, the rear frame 30 and the front frame 20 may be bonded to each other through mechanical bonding such as clinching or spot welding. The clinching refers to bonding between a first member and a second member by placing the first member and the second member face-to-face and pressing them using a press, and the spot welding refers to directly bonding the two members by applying heat and pressure in a state where the first member and the second member are brought into contact.

A plurality of coupling portions may be formed in the bonding portion 23. For example, the plurality of coupling portions may be formed in a spot shape and disposed throughout the bonding portion 23.

The bonding portion 23 may be configured to include a plurality of through holes TH. The through hole TH easily informs the position of the clinching position when the rear frame 30 is clinched to the front frame 20.

On the other hand, the rear frame 30 is configured to include an insert 31 formed at the end. The insert 31 may be formed by bending the end of the rear frame 30 forward. When the rear frame 30 is fastened to the rear of the front frame 20, the insert 21 may be inserted between the edge portion 21 and the seating portion 23 of the front frame 20 so that the rear frame 30 may be fastened to the front frame 30.

FIG. 7 shows a rear view of a rear frame, and FIG. 8 shows a cross-sectional view taken along line II-II' of FIG. 7.

Referring to these drawings, the rear frame 30 may include a receiving portion 33 positioned at the bottom. The receiving portion 33 mounts various driving boards necessary for driving the device, for example, a T-con board, a power supply board, and a main board.

The receiving portion 33 may be formed to be concave inwardly by pressing a portion of the rear frame 30 forward. It is possible to effectively reduce the thickness of the device based on the receiving portion 33 being formed to be concave inwardly. The receiving portion 33 may be formed to contact the front frame 20.

The front frame 20 and the rear frame 30 of one embodiment may be configured to have a thickness thinner than 1 mm, respectively. Meanwhile, since the front frame 20 is bonded to the display panel 10, the cross-section has substantially a flat shape. Therefore, in order to increase the structural rigidity and to create a space for heat dissipation, the rear frame 20 is configured to have an arch shape to increase the structural rigidity of the frame.

The rear frame may be formed to have an arch shape that is gradually convex backward from an end at which the insert 31 is formed to a portion at which the receiving portion 33 is formed. Accordingly, the gap between the rear frame 30 and the front frame 20 is greater at the portion where the receiving portion 33 is formed than at the end portion where the insert 31 is formed.

Meanwhile, FIG. 9 shows a bonding state between the display panel 10 and the front frame 20 in a cross-section taken along line III-III' of FIG. 1.

As illustrated in FIG. 9, the display panel 10 may be configured to include a driving board DB disposed on the lower rear side.

The driving board DB may be disposed by being folded toward the rear surface of the display panel 10 and bundled together. The driving board DB may be electrically connected to the display panel 10 through a flexible cable FP.

As the driving board DB is disposed on the back side of the display panel 10, the thickness of the display panel 10 may be increased.

In the front frame 20, the above-described seating portion 23 may be positioned at a portion related to the position where the driving board DB is disposed. The seating portion 23 may be configured to have a width d4 greater than that of the driving board DB to accommodate the driving board DB.

When the display panel 10 and the front frame 20 are coupled, the driving board DB may be inserted into the seating portion 23, and may be coupled to the front frame 20 and the rear frame 30 since the coupling portion is formed on a part of the seating portion 23.

Hereinafter, a display device according to another embodiment will be described. FIG. 10 is an exploded perspective view of a display device according to another embodiment, and FIG. 11 is a view showing a combination of a device shown in FIG. 10.

Referring to these drawings, the display device according to an embodiment may include a display panel 100, a front frame 200, and a rear frame 300.

The display panel 100 is disposed on the front side of the device 10, and displays an image. The display panel 100 may have a thin thickness of about 1 mm or more, and may have a rectangular shape having a horizontal length longer than a vertical one. The size of the display panel 100 may be determined based on the size of the screen.

The front frame 200 and the rear frame 300 form a set to support the display panel 100. Among them, the front frame 200 is positioned closer to the display panel 100 than the rear frame 300, and thus the display panel 100 may be substantially attached to the front frame 200.

More precisely, the display panel 100 may be attached to a panel adhesive area AA provided by the front frame 200 through an adhesive means such as a double-sided tape. The panel adhesive area AA may be defined by an edge portion 210 forming a border of the device. The edge portion 210 may be formed on the front frame 200, and may be formed by curling a portion of an end of the front frame 200. This will be described later.

The front frame 200 may be disposed to face the front frame 200 such that the panel adhesive area AA faces the display panel 100. The display panel 100 is positioned and fixed in the panel adhesive area AA. At this time, the edge portion 210 of the front frame 20 surrounds the side surface of the display panel 100 to protect the display panel 100 from physical impact. When viewed from the front, the edge portion 210 functions as a bezel, but the width thereof is so thin that it appears as if there is substantially no bezel.

The rear frame 300 may be positioned in the rear of the front frame 200. Since the front frame 200 is interposed between the rear frame 300 and the display panel 100, the rear frame 300 does not directly contact the display panel 100.

The rear frame 300 may have substantially the same size as the front frame 200, may be coupled to the front frame 200, and may support the display panel 100.

In one embodiment, it is possible to reduce the weight of the device by reducing the thickness of the frame based on the frame supporting the display panel 100 being made of a set of the front frame and the rear frame. In addition, a space for convective heat dissipation may be formed between the front frame 200 and the rear frame 300 to improve heat dissipation performance.

The front frame 200 has a square box shape by the edge portion 210, and defines a receiving space 230.

The rear frame 300 is inserted and fastened to the receiving space 230 of the front frame 200.

FIGS. 12 to 14 are views for illustrating the front frame 200, FIG. 13 is a view showing a cross-section in a vertical direction, and FIG. 14 is a view showing a cross-section in a horizontal direction.

The front frame 200 has a rectangular shape longer horizontally than vertically. The front frame 200 is configured to include a panel adhesive area AA to which the display panel 100 is attached to the front side, and an edge portion 210 defining a heat dissipation space toward the rear and the receiving space 230 into which the rear frame 300 is inserted and fastened. The edge portion 21 may be formed at an end of a bottom portion 201 to which the display panel is attached.

The bottom portion 201 is a portion to which the display panel 100 is adhered in contact with the surface, and has a substantially rectangular large area and is formed as a flat surface.

In addition, the bottom portion 201 may be formed on the lower side, and may include a seating portion 250 in which the driving board DB is accommodated.

The edge portion 210 is formed entirely along the circumference of the front frame 200, and has a shape protruding toward the rear.

The edge portion 210 may include first to fourth edge portions 210a to 210d based on positions. The first edge portion 210 and the second edge portion 210b are formed on the upper and lower long sides of the front frame 200, respectively, and the third edge portion 210c and the fourth edge portion 210d are formed on the left and right short sides, respectively.

The edge portion 210 may be formed by bending the end of the bottom portion 201 toward the rear. The edge portion 210 includes a first part 201 protruding toward the front, a second part 202 protruding backward from the first part 201, and a third part 203 folded inward toward the front in second part 202.

FIGS. 15 to 17 are views for illustrating the rear frame 300, FIG. 15 shows an entire rear view, FIG. 16 is a view showing a cross-section in a vertical direction, and FIG. 17 is a view showing a cross-section in a horizontal direction, respectively.

Referring to these drawings, the rear frame 300 is configured to have a rectangular box shape similar to the front frame 200. To this end, the rear frame 300 may be configured to include a flat portion 310 and a bending portion 320.

The flat portion 310 is a portion forming the bottom of the rear frame 300, and is configured to have substantially a flat bottom surface. The flat portion 310 may also be configured to include a receiving portion 311 on which the driving board is mounted. The receiving portion 311 may be formed by pressing the flat portion 310 toward the front.

The bending portions 320 may be formed at four direction ends of the flat portion 310. The bending portion 310 may be formed by bending the end of the flat portion 310 forward. Here, the bending portion 320 is formed in four directions, and includes the first to fourth bending portions 320.

Accordingly, the rear frame 300 may be configured to have a "⊏"-shaped cross section in both the horizontal and vertical directions.

The rear frame 300 having such a shape may be inserted into the rear of the front frame 200, that is, into the receiving space 230 and fastened to the rear frame 300.

Meanwhile, the rear frame 300 may be configured to further include a clip 400 inserted and fastened to the bending portion 310. A plurality of clips 400 may be fixed to the bending portion 310 in consideration of the fastening force and the size of the device.

FIG. 18 is a view showing a clip is disassembled with a rear frame.

In FIG. 18, as the clip 400 is formed, the rear frame 300, more precisely, the bending portion 310 may include a cutout portion 320. The cutout portion 320 may be formed at a position where the clip 400 is fastened, and may be formed by partially removing the bending portion 310.

Protrusions 330 may be further formed on both sides of the cutout portion 320. When the clip 400 is fastened to the bending portion 310, the protrusion 330 allows the clip, or more precisely, the insert 410 to be inserted and fastened so that the clip 400 is stably fixed.

The clip 400 may be configured to include a body 410 fitted to the bending portion 310, a locking portion 430 formed to face the body 410, having tension, and formed as an inclined surface, and inserts 420a, 420b formed as a pair on both sides of the locking portion 430.

The inserts 420a, 420b may be formed with a fastening groove inserted and fastened to the protrusion 330 therein.

The clip 400 may be fastened by being inserted into the bending portion 310 in the direction of the arrow.

FIG. 19 shows a cross-sectional view in a state in which the clip is fastened to the bending portion and cut around the locking portion 430.

As illustrated in FIG. 19, the locking portion 430 includes a first member 431 having an inclined surface and a second member 433 bent at an end of the first member 431.

The inclined surface of the first member 431 is formed to be inclined upward with respect to the flat surface of the bending portion 310, and the cutout portion 320 is formed in the bending portion 310 related to the first member 431. Accordingly, after the first member 431 moves inside the cutout portion 320 by a tension operation, it may be restored to its original position by the stored recovery force.

FIG. 20 shows a state in which the front frame 200 is fastened to the rear frame 300 through a clip.

In FIG. 20, the front frame 200 may be fixed to the rear frame 300 by moving in the direction of the arrow in the straight direction. At this time, the rear frame 300 is coupled to the edge portion 210 of the front frame 200 so that the bending portion 310 is engaged inside.

At this time, the edge portion 210 is guided upward along the outer surface of the bending portion 310, and in particular, is guided along the inclined surface of the first member 431 of the clip 400, and as a result, the locking portion 430 moves in the horizontal direction. The locking portion 430 is restored to its original position by the stored tension based on the front frame 200 being completely coupled to the rear frame 300. In this case, the front frame 200 and the rear frame 300 may be fixed while the second member 433 is caught on the edge portion 210.

FIG. 21 shows a state in which a spacer is disposed to maintain a gap in the heat dissipation space between the front frame and the rear frame, and FIG. 22 shows an example of the spacer.

As described above, the front frame 200 and the rear frame 300 are fastened to form a heat dissipation space therebetween.

According to an embodiment, both the front frame 200 and the rear frame 300 are configured to have a thickness less than 1 mm. Therefore, the structural rigidity may be weak.

In one embodiment, the structural rigidity may be increased by disposing the spacer 500 in the heat dissipation space.

The spacer 500 may be configured to have a grid shape.

According to an example, the spacer 500 may be configured to include a plate 510 and a grid portion 520 protruding in a grid shape from both sides of the plate 510, respectively.

Due to the grid portion 520, when the spacer 500 is viewed from the front and rear, respectively, a grid pattern may be seen.

The spacer 500 having such a shape may be made of various materials.

The above detailed description should not be construed as restrictive in all respects and should be considered as exemplary. The scope of the present disclosure should be determined by a reasonable interpretation of the appended claims, and all modifications within the equivalent scope of the present disclosure are included within the scope of the present disclosure.

The invention claimed is:

1. A display device comprising:
    a display panel;
    a front frame attached to a rear of the display panel, wherein the front frame comprises a frame panel area positioned behind an entire area of the display panel; and
    a rear frame coupled to a rear of the front frame,
    wherein the front frame and the rear frame are pressed together, and the front frame includes a rectangular band-shaped seating portion formed along a border of the device, and
    wherein the rear frame includes a coupling portion mechanically bonded to the seating portion.

2. The display device of claim 1, wherein the front frame includes an edge portion bent to be contiguous to the seating portion and forming the border of the device, and wherein:
    the rear frame includes an insert bent toward the front frame, and
    the insert is inserted and fastened into the edge portion.

3. The display device of claim 1, wherein the mechanical bonding is either clinching or spot welding.

4. The display device of claim 2, wherein:
    the rear frame comprises a receiving portion which is formed in a forward direction, and
    the rear frame has a rearward convex shape extending from the insert to the receiving portion is formed.

5. The display device of claim 1, comprising:
    a driving board disposed on a rear side of the display panel,
    wherein the driving board is accommodated in the seating portion.

6. The display device of claim 1, wherein a rear of the display panel is attached to the frame panel area by an adhesive.

7. The display device of claim 1, wherein the seating portion is bent to be contiguous to the frame panel area.

8. A display device comprising:
    a display panel;
    a front frame including a bottom portion positioned behind an entire area of the display panel and to which a rear of the display panel is attached, and an edge portion at an edge of the bottom portion and bent rearward;
    a rear frame inserted and fastened to a receiving space defined by the edge portion; and
    a clip fastening the front frame and the rear frame.

9. The display device of claim 8, wherein the rear frame includes a flat portion facing the bottom portion at a predetermined distance and a bending portion bent toward the front frame at an end of the flat portion.

10. The display device of claim 9, wherein the edge portion includes a first part protruding forward, a second part protruding rearward from the first part, and a third part folded inward toward a front from the second part.

11. The display device of claim 10, wherein the clip includes a body fitted to the bending portion, and a locking portion having tension and protruding from the body toward the edge portion to engage the third part and couple the front frame and rear frame.

12. The display device of claim 11, wherein the edge portion includes a first part protruding forward, a second part folded laterally outwards from the first part and protruding rearward, and a third part folded between the first part and the first part in the second part.

13. The display device of claim 11, wherein the bending portion includes a cutout portion formed to correspond to the locking portion.

14. The display device of claim 13, wherein the locking portion includes a first member having an outwardly angled surface, and a second member inwardly bent from the first member toward the body of the clip.

15. The display device of claim 8, further comprising:
a spacer disposed between the front frame and the rear frame.

16. The display device of claim 15, wherein the spacer includes a plate and a grid portion protruding from the plate in a grid shape.

* * * * *